(12) United States Patent
Qiao et al.

(10) Patent No.: US 11,283,218 B2
(45) Date of Patent: Mar. 22, 2022

(54) ELECTRICAL CONNECTOR ASSEMBLY

(71) Applicant: 3M INNOVATIVE PROPERTIES COMPANY, St. Paul, MN (US)

(72) Inventors: YunLong Qiao, Singapore (SG); Saujit Bandhu, Singapore (SG); Kok Hoe Lee, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 30 days.

(21) Appl. No.: 16/946,797

(22) Filed: Jul. 7, 2020

(65) Prior Publication Data

US 2021/0075161 A1 Mar. 11, 2021

Related U.S. Application Data

(60) Provisional application No. 62/896,062, filed on Sep. 5, 2019.

(51) Int. Cl.
| | |
|---|---|
| *H01R 13/633* | (2006.01) |
| *H01R 13/6592* | (2011.01) |
| *H01R 13/66* | (2006.01) |
| *H05K 7/20* | (2006.01) |
| *H01R 12/79* | (2011.01) |
| *H01R 13/502* | (2006.01) |
| *H01R 12/77* | (2011.01) |

(52) U.S. Cl.
CPC ....... *H01R 13/6335* (2013.01); *H01R 12/771* (2013.01); *H01R 12/79* (2013.01); *H01R 13/502* (2013.01); *H01R 13/6592* (2013.01); *H01R 13/6658* (2013.01); *H05K 7/2039* (2013.01)

(58) Field of Classification Search
CPC ............ H01R 13/6335; H01R 13/6592; H01R 13/6658; H01R 13/502; H01R 12/79; H01R 12/771; H05K 7/2039
USPC ................................................ 439/352, 76.1
See application file for complete search history.

(56) References Cited

U.S. PATENT DOCUMENTS

| | | | |
|---|---|---|---|
| 10,916,877 B1* | 2/2021 | Khazen | H01R 13/6658 |
| 10,921,536 B2* | 2/2021 | Park | G02B 6/4269 |
| 10,942,323 B1* | 3/2021 | Togami | G02B 6/4269 |
| 2013/0077254 A1* | 3/2013 | Nguyen | G02B 6/4269 |
| | | | 361/715 |
| 2014/0322933 A1* | 10/2014 | Li | H01R 12/63 |
| | | | 439/76.1 |

(Continued)

*Primary Examiner* — Gary F Paumen
(74) *Attorney, Agent, or Firm* — Robert Moshrefzadeh; 3M Innovative Properties Compa

(57) ABSTRACT

An electrical connector assembly includes a housing having an upper housing half removably assembled to a lower housing half via a plurality of fasteners. A circuit board is at least partially disposed in a housing cavity formed by the upper and lower housing halves. The circuit board includes a plurality of conductive front and rear pads electrically connected to each other. Flat cables terminate at the conductive rear pads disposed on upper and lower major surfaces of the circuit board. A plurality of alternating ridges and channels is disposed on a top side of the upper housing half, extending along a length of the housing. Bottom surfaces of the channels along a length of the channels are at a same height or higher than uppermost surfaces of the fasteners in the plurality of fasteners. The channels are configured to transfer heat generated by the connector assembly.

15 Claims, 9 Drawing Sheets

(56) References Cited

U.S. PATENT DOCUMENTS

| | | | | |
|---|---|---|---|---|
| 2014/0349496 | A1* | 11/2014 | Zhu | H05K 1/0219 |
| | | | | 439/108 |
| 2015/0280368 | A1* | 10/2015 | Bucher | H01R 12/716 |
| | | | | 439/487 |
| 2016/0064873 | A1* | 3/2016 | Bucher | H01R 13/6658 |
| | | | | 385/88 |
| 2016/0093966 | A1* | 3/2016 | Behziz | H05K 1/0219 |
| | | | | 439/607.28 |
| 2018/0338387 | A1* | 11/2018 | Park | G02B 6/4269 |
| 2019/0013617 | A1* | 1/2019 | Ayzenberg | H05K 9/0058 |
| 2020/0161781 | A1* | 5/2020 | Qiao | H01R 12/50 |

* cited by examiner

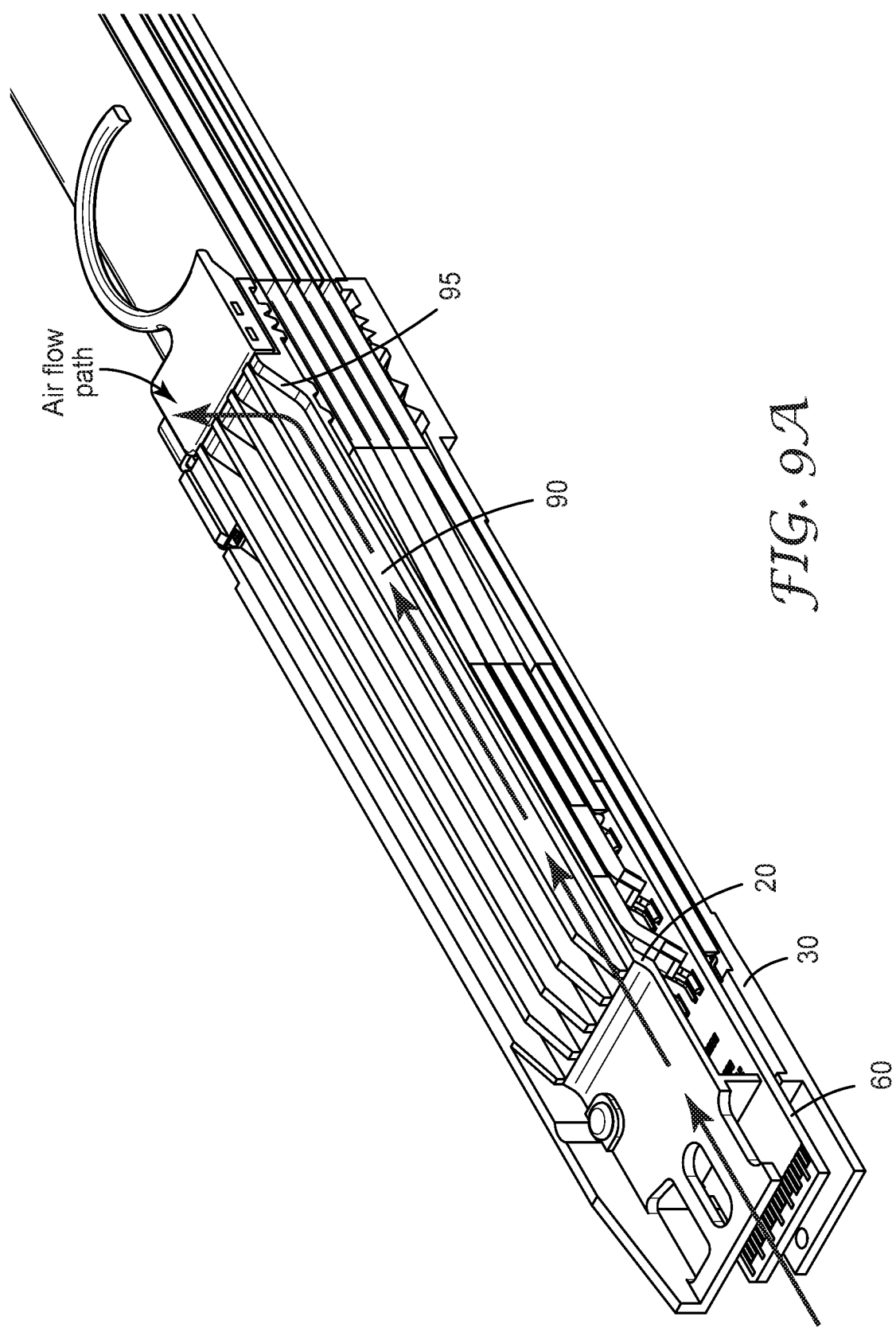

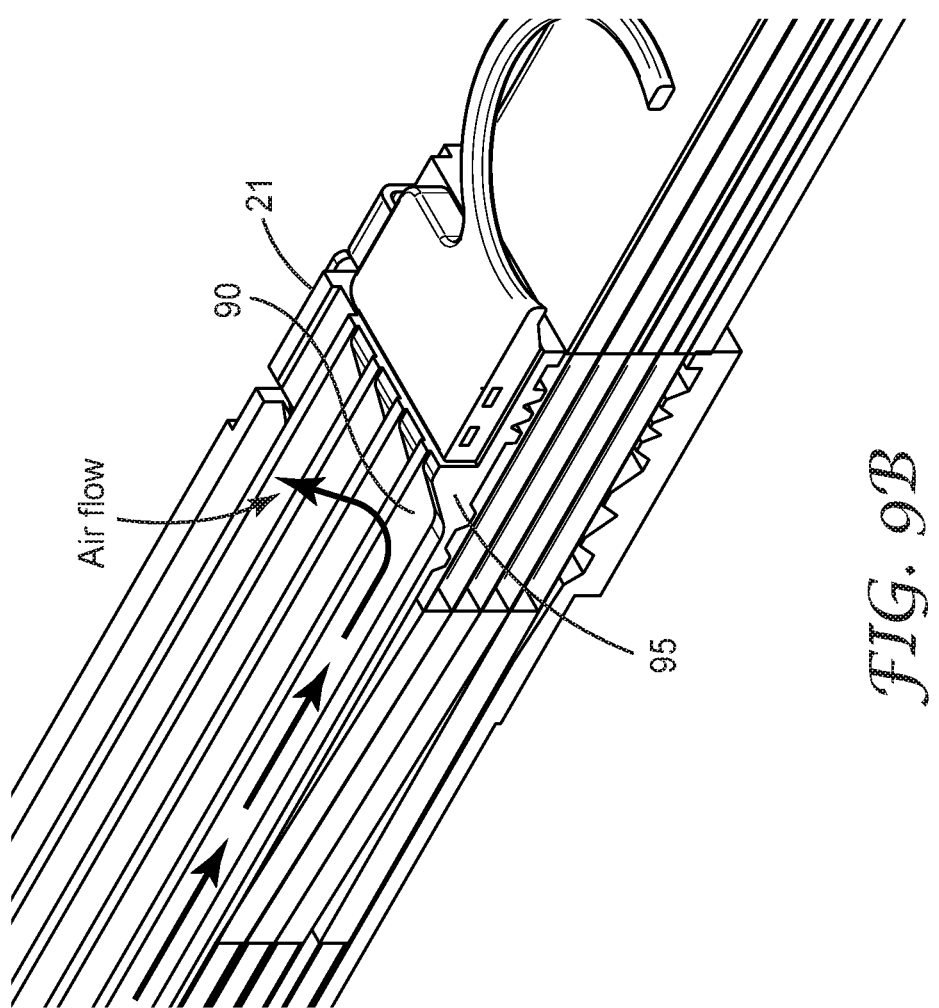

US 11,283,218 B2

ELECTRICAL CONNECTOR ASSEMBLY

TECHNICAL FIELD

The present disclosure generally relates to electrical connector assemblies, particularly electrical connector assemblies with heat dissipation capabilities.

BACKGROUND

Network devices use optical cable to deliver faster and more reliable communication. An optical pluggable module is a transceiver that has one end connected to an optical cable, electronics that translate the optical signal into an electronic signal, and another end plugged into a network device that will process the electronic signal. Examples of optical pluggable module form factors include SFP (small form-factor pluggable), QSFP (quad small form-factor pluggable) and OSFP (octal small form-factor pluggable). As the industry is moving toward a higher data rate per cable, the quad small form-factor pluggable double density (QSFP-DD) interface has been introduced to carry double the data capacity of a QSFP cable assembly. OSFP cable assemblies have double the data bandwidth compared to the QSFP standard. The OSFP is similar to the QSFP-DD interface but uses one row of mating interface to achieve the 8 high speed channel design. The OSFP cable assembly has a structure similar to the QSFP and QSFP-DD by using upper and lower metal shell to cover the PCB inside which it connects to the cable.

SUMMARY

Various aspects and embodiments described herein relate to electrical connector assemblies.

Some aspects of the disclosure relate to an electrical connector assembly including a housing. The housing includes an upper housing half removably assembled to a lower housing half via a plurality of fasteners. The upper and lower housing halves define a housing cavity therebetween. A circuit board is at least partially disposed in the housing cavity. The circuit board includes a mating end for mating with electrical contacts of a mating connector. The circuit board further includes a cable end opposite the mating end and disposed inside the housing cavity. A plurality of conductive front pads is disposed near the mating end of the circuit board. A plurality of conductive rear pads is disposed between the front pads and the cable end and are electrically connected to the front pads. Stacked first, second and third flat cables terminated at the conductive rear pads are disposed on an upper major surface of the circuit board. A fourth flat cable terminated at the conductive rear pads is disposed on an opposing lower major surface of the circuit board. A plurality of alternating ridges and channels is disposed on a top side of the upper housing half, extending along a length of the housing. Bottom surfaces of the channels along a length of the channels are at a same height or higher than uppermost surfaces of the fasteners in the plurality of fasteners.

Other aspects of the disclosure relate to an electrical connector assembly including a housing. The housing includes an upper housing half removably assembled to a lower housing half via a plurality of fasteners. The upper and lower housing halves define a housing cavity therebetween. A circuit board is at least partially disposed in the housing cavity and includes a plurality of conductive pads. At least three flat cables are terminated at the conductive pads. A plurality of alternating ridges and channels is disposed on a top side of the upper housing half, extending along a length of the housing. The channels include open front and rear ends. Bottom surfaces of the channels along a length of the channels are at a same height or higher than uppermost surfaces of the fasteners in the plurality of fasteners. The bottom surface of each channel includes an inclined surface portion disposed between substantially horizontally oriented front and rear surface portions.

These and other aspects of the present application will be apparent from the detailed description below. In no event, however, should the above summaries be construed as limitations on the claimed subject matter, which subject matter is defined solely by the attached claims.

BRIEF DESCRIPTION OF DRAWINGS

The various aspects of the disclosure will be discussed in greater detail with reference to the accompanying figures where, FIG. 1 schematically shows an isometric view of an electrical connector assembly according to some aspects of the disclosure;

FIGS. 9A and 9B schematically illustrate different cross sectional views of the connector assembly showing the air flow path.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

In the following description, reference is made to the accompanying drawings that form a part hereof and in which various embodiments are shown by way of illustration. It is to be understood that other embodiments are contemplated and may be made without departing from the scope or spirit of the present description. The following detailed description, therefore, is not to be taken in a limiting sense.

As OSFP front interface changed from QSFP-DD double row to single row, the overall width of the PCB and the OSFP housing has increased. Since the width of the housing has increased, the existing QSFP-DD method of fastening the two halves of the housing may not be suitable as it holds only one side of the housing, which may result in improper closure of the OSFP housing. Further, as the processing speeds of the devices increase and the space for mounting components and packaging remains limited, the optical module is becoming more and more power dense, and cooling of the module (and electronics in the module) can become more important. Embodiments described herein address these and other challenges.

Figure 8:
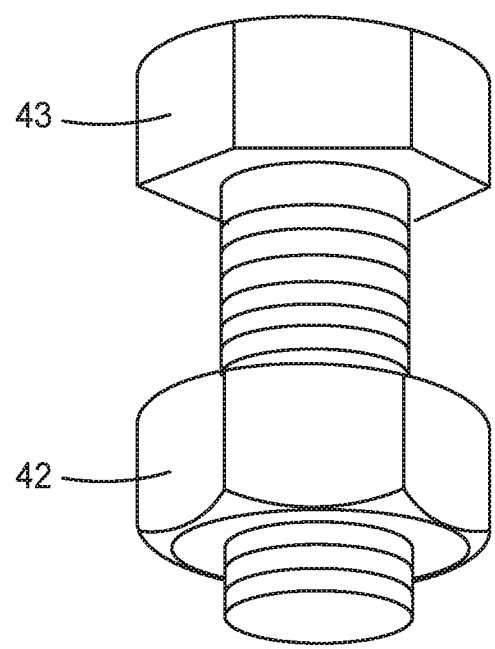
FIG. 8 schematically shows an exemplary fastener for assembling upper and lower halves of an electrical connector housing according to some aspects of the disclosure.

In some aspects of the disclosure an electrical connector, as illustrated in FIGS. 1-6, is provided. The electrical connector (200) includes a housing (10) having an upper housing half (20) removably assembled to a lower housing half (30) via a plurality of fasteners (40). In some aspects, the upper and lower housing halves may be made of metal. In some embodiments, the housing (10) is a housing of an octal small form-factor pluggable (OSFP) connector (400). At least one of the fasteners in the plurality of fasteners (40) may include a nut (42) threadably engaging a bolt (43), as best shown in FIG. 8. In other aspects, at least one of the fasteners in the plurality of fasteners (40) may include a rivet.

Figure 4:
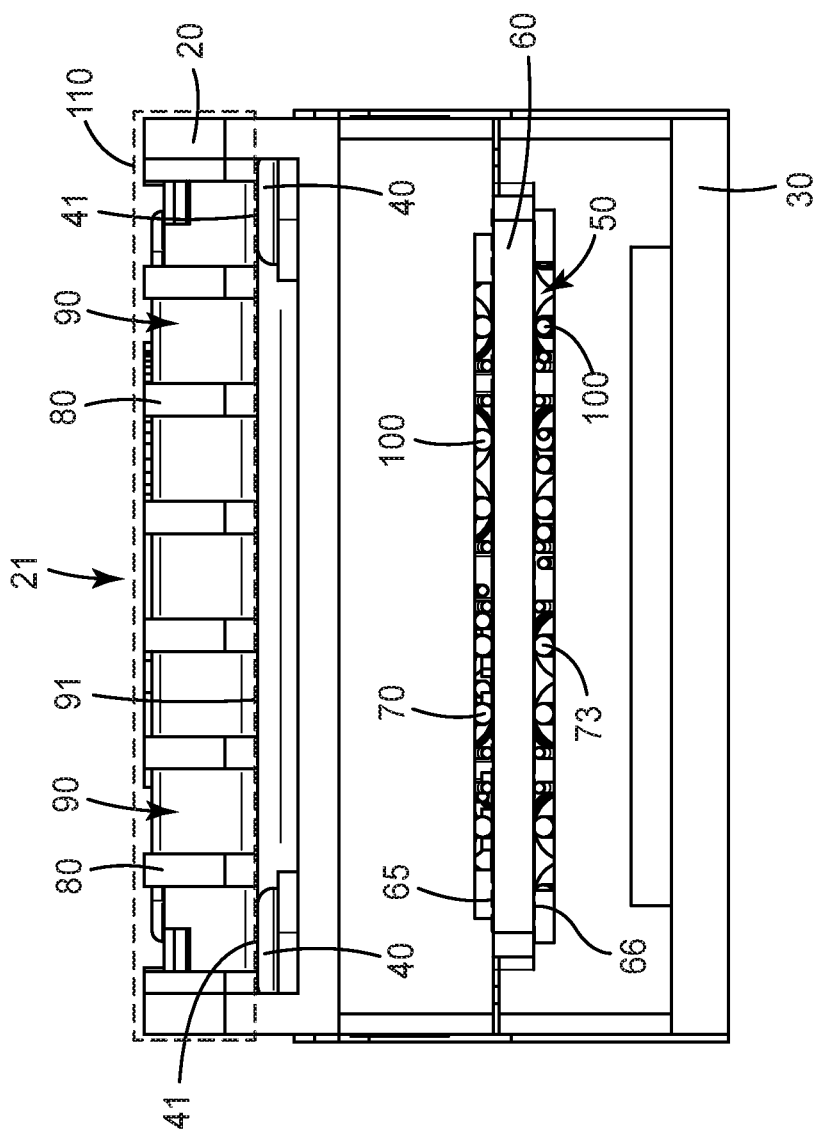
FIG. 4 schematically shows a front view of an electrical connector illustrating the position of the air flow channel with respect to the fasteners.
Figure 5:
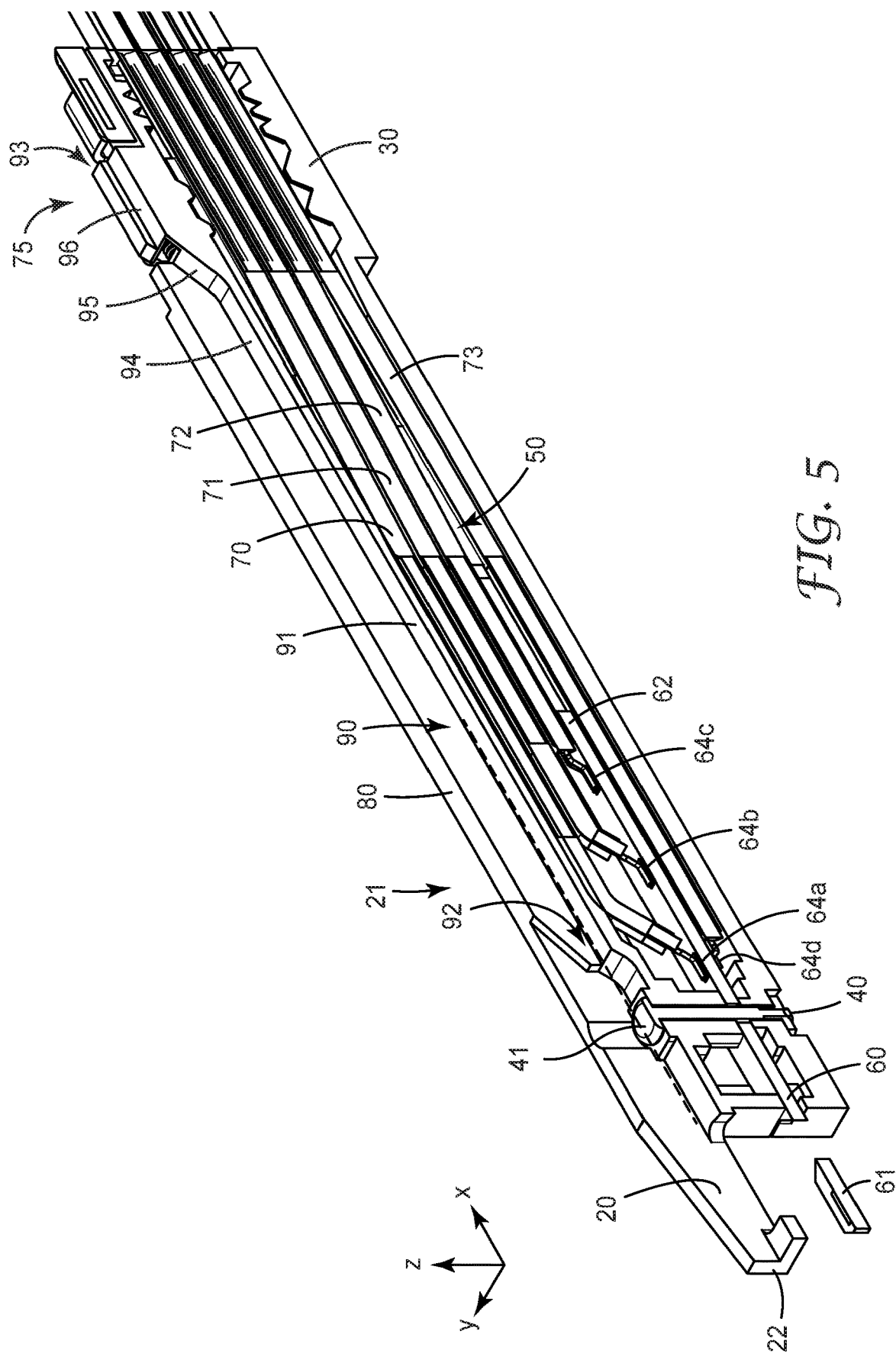
FIGS. 5 and 6 schematically show different cross sectional views of the electrical connector assembly according to some aspects of the disclosure.
Figure 6:
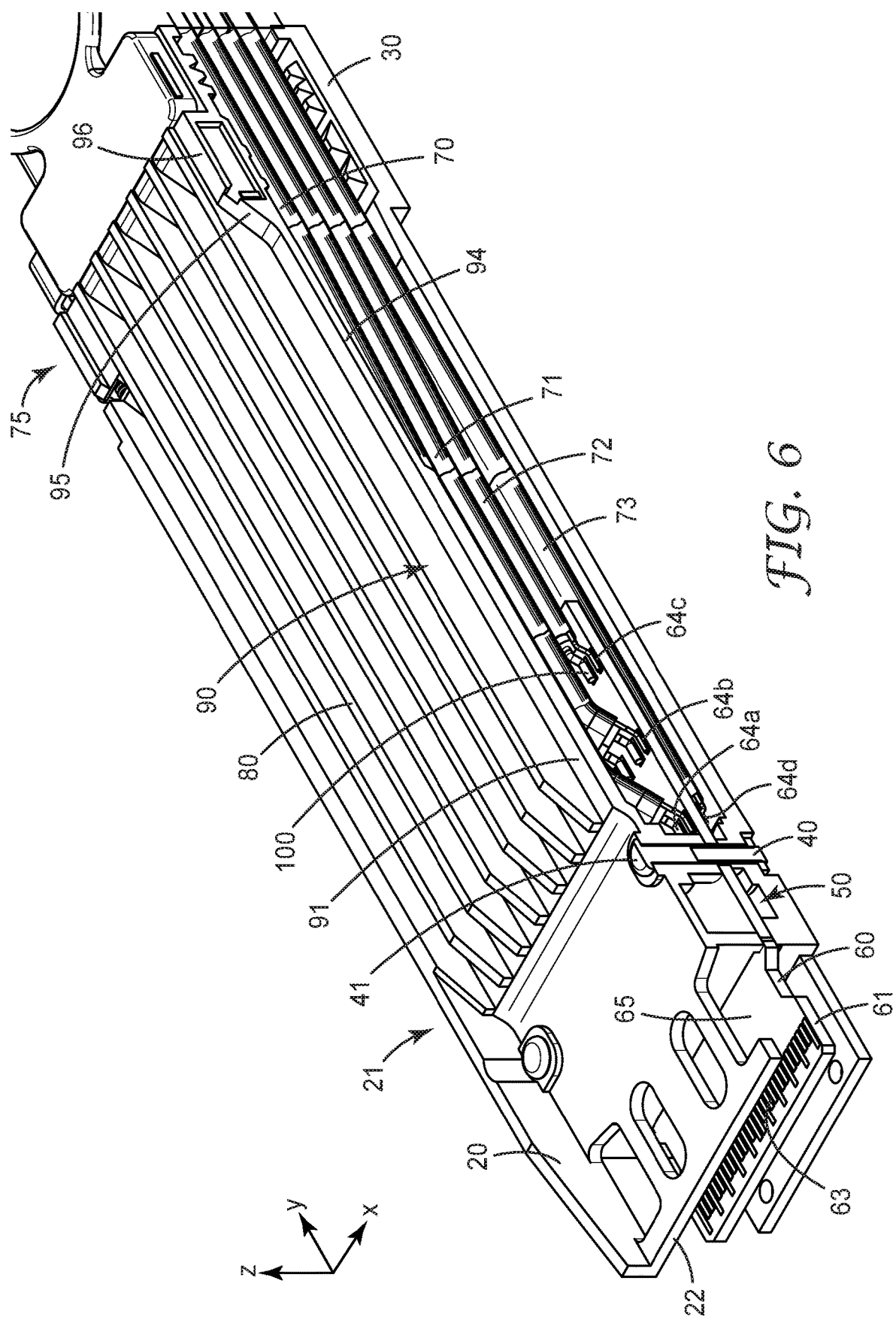
Figure 7:
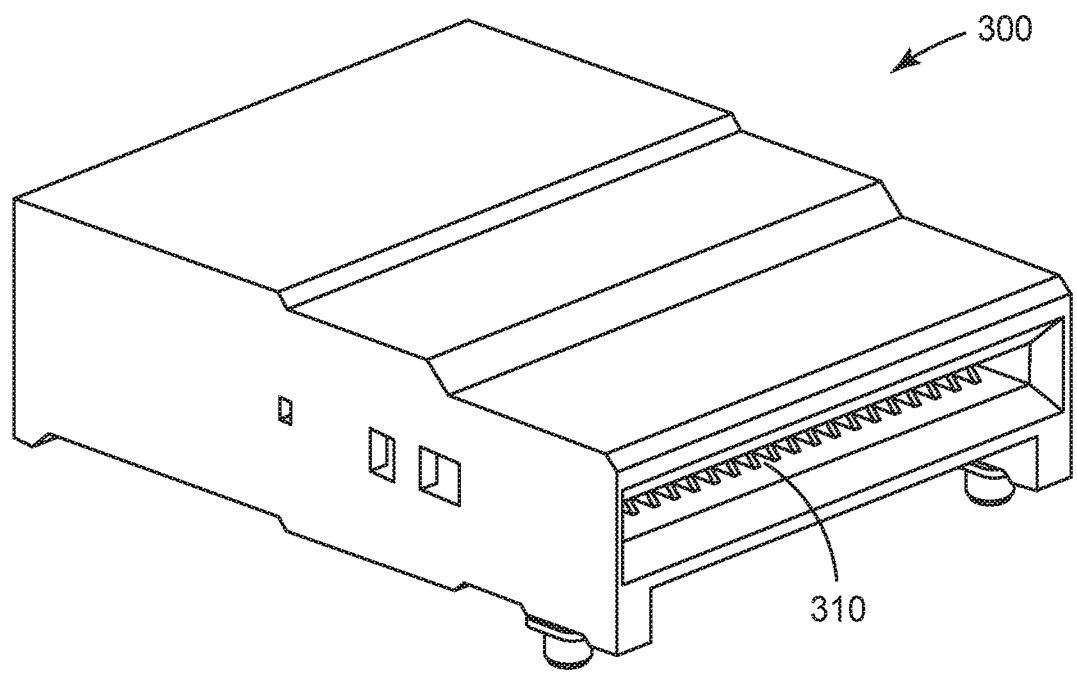
FIG. 7 schematically shows a mating connector for mating with a connector assembly according to an aspect of the disclosure.

The upper and lower housing halves (20, 30) define a housing cavity (50) therebetween as can best be seen in the front view of the electrical connector schematically illustrated in FIG. 4 and in the cross sectional views schematically illustrated in FIGS. 5 and 6 of the accompanying drawings. The housing cavity (50) at least partially encloses a printed circuit board (60) and the circuit board (60) is configured to couple the connector assembly (200) to a mating connector (300). A schematic view of a mating connector (300) for coupling with the connector assembly (200) is shown in FIG. 7. For example, the circuit board (60) may be a printed circuit board in a network device such as a network switch or network router, which receives multiple connector assemblies (200), for instance, OSFP transceiver modules, into multiple mating connectors (300).

In some aspects, the circuit board (60) is at least partially disposed in the housing cavity (50) and includes a mating end (61) for mating with electrical contacts (310) of the mating connector (300). The circuit board (60) includes a cable end (62) opposite the mating end (61) as best seen in the exploded view of the electrical connector schematically illustrated in FIG. 2. The cable end (62) of the circuit board may be disposed inside the housing cavity (50), as best seen in the cross sectional view of the electrical connector assembly schematically illustrated in FIG. 5.

The circuit board (60) includes a plurality of conductive pads (63, 64). In some aspects, a plurality of conductive front pads (63) is disposed near the mating end (61) of the circuit board. A plurality of conductive rear pads (64) is disposed between the front pads (63) and the cable end (62) and are electrically connected to the front pads (63).

In some aspects, the plurality of conductive front pads (63) forms a first row (63*a*) and a second row (63*b*) of conductive front pads (63). The first row (63*a*) of conductive front pads may be disposed on an upper major surface (65) of the circuit board near the mating end (61). The second row (63*b*) of conductive front pads may be disposed on a lower major surface (66) of the circuit board (60) near the mating end (61).

In some aspects, the plurality of conductive rear pads (64) include first (64*a*), second (64*b*) and third (64*c*) rows of conductive rear pads (64). The first (64*a*), second (64*b*) and third (64*c*) rows of conductive rear pads (64) are spaced apart from, and substantially parallel to, each other. The first (64*a*), second (64*b*) and third (64*c*) rows of conductive rear pads (64) are disposed on the upper major surface (65) of the circuit board (60) between the front pads (63) and the cable end (62). A fourth row (64*d*) of conductive rear pads (64) may be disposed on a lower major surface (66) of the circuit board (60) between the front pads (63) and the cable end (62) as can best be seen in FIG. 3. The plurality of conductive rear pads (64) is electrically connected to the conductive front pads (63) e.g., via one or more conductive pathways or traces defined in the circuit board (60).

Figure 1:
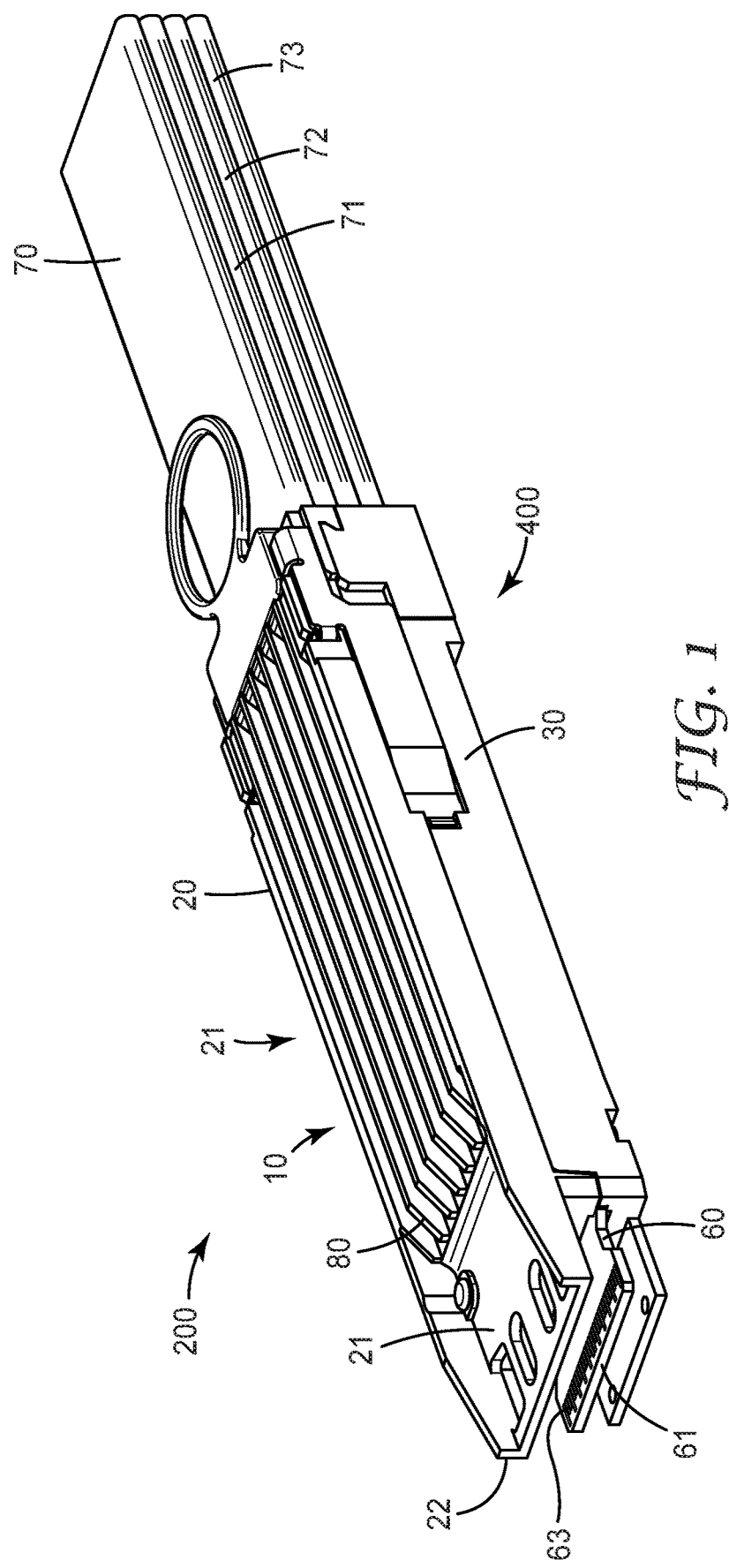
Figure 2:
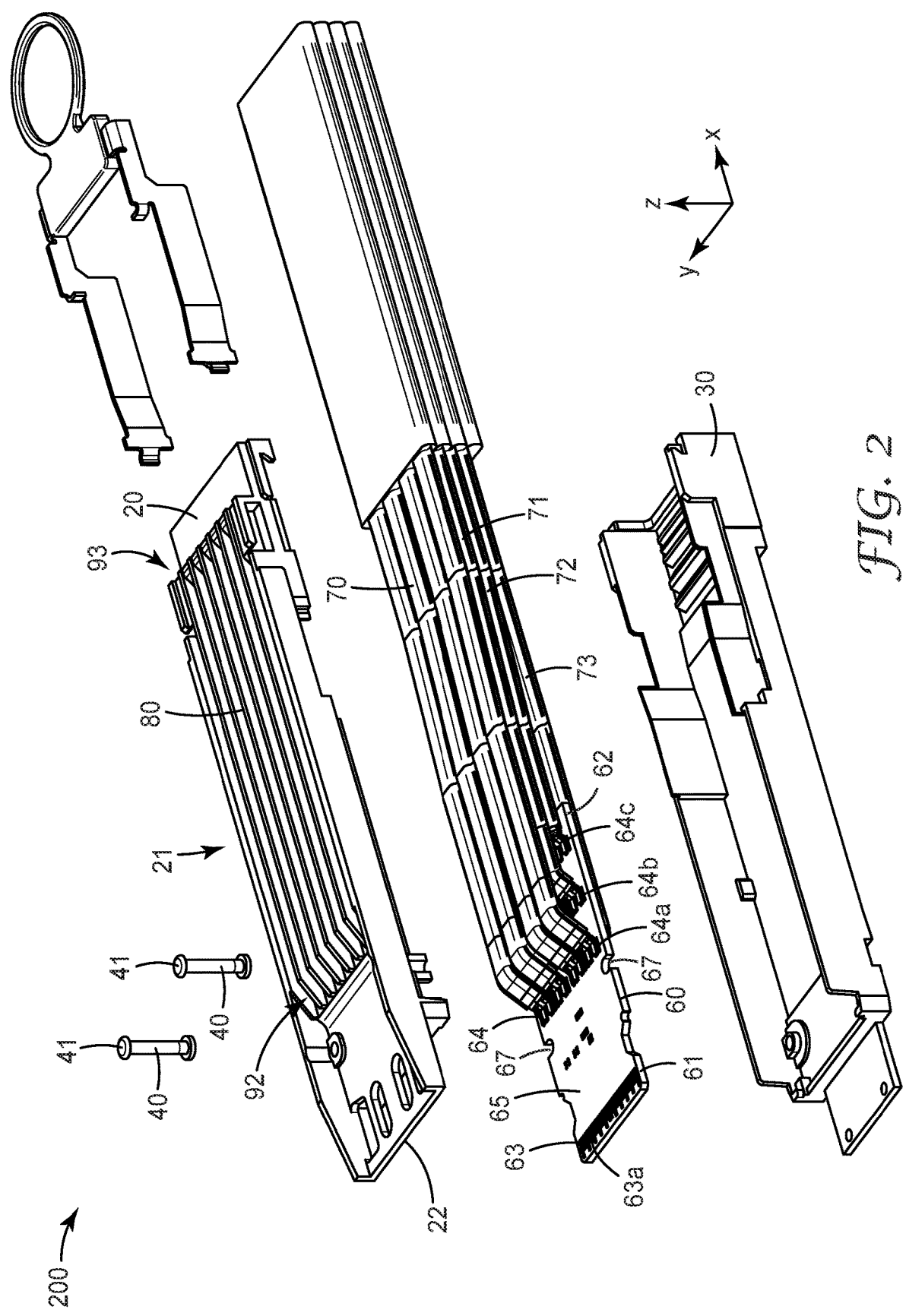
FIGS. 2 and 3 schematically show different exploded views of an electrical connector assembly according to some aspects of the disclosure.
Figure 3:
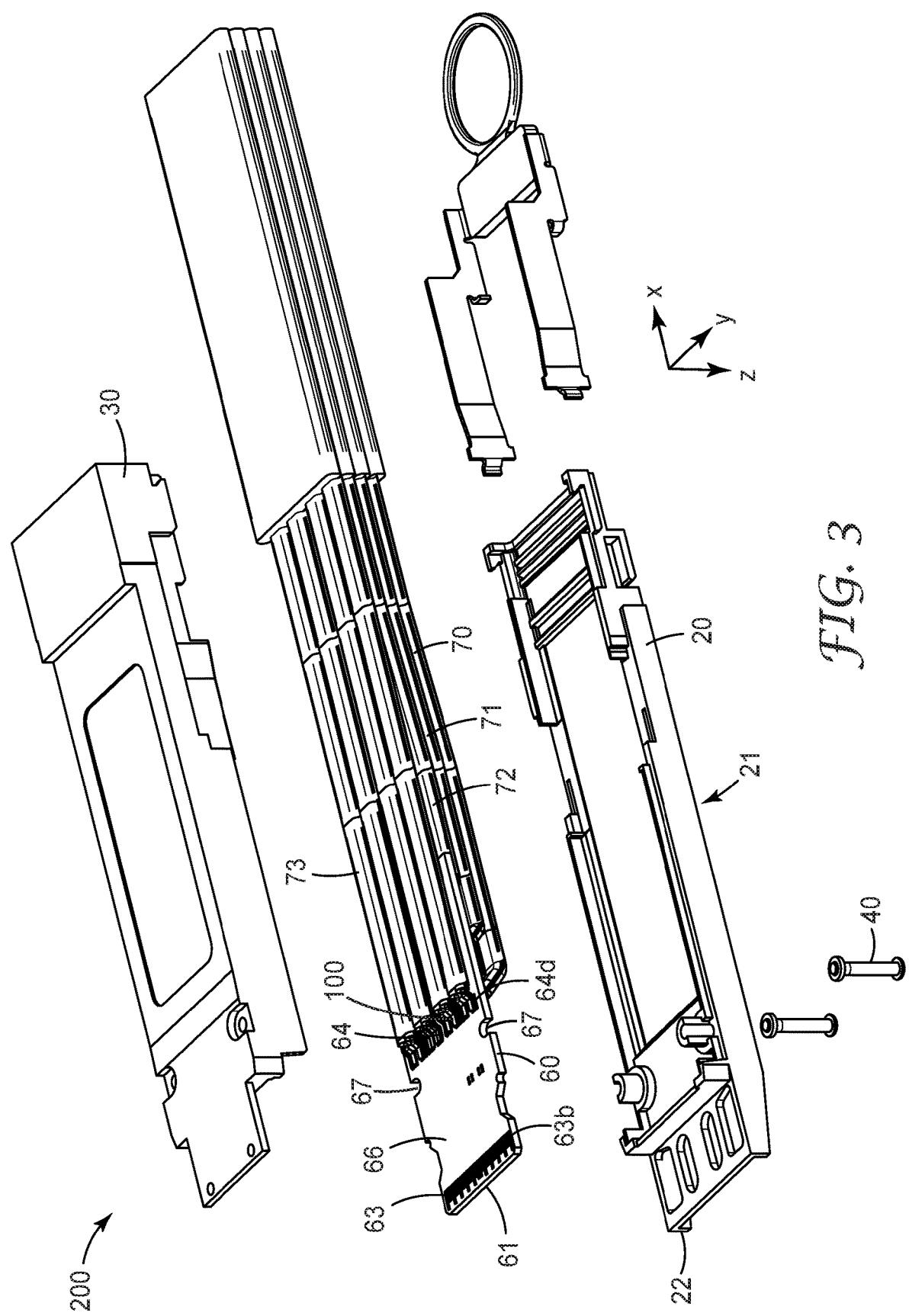

As illustrated in FIGS. 1-3, at least three flat cables (70-73) terminate at the conductive pads (63, 64). In some aspects, first (70), second (71) and third (72) flat cables are arranged to be in a stacked configuration. The stacked first, second and third flat cables terminate at the conductive rear pads (64) disposed on an upper major surface (65) of the circuit board as best seen in FIG. 2. In some embodiments, a fourth flat cable (73) terminates at the conductive rear pads (64) disposed on an opposing lower major surface (66) of the circuit board as shown in FIG. 3. Particularly, the first (70), second (71) and third (72) flat cables terminate at the respective first (64*a*), second (64*b*) and third (64*c*) rows of conductive rear pads (64). The fourth flat cable (73) is terminated at the fourth row (64*d*) of conductive rear pads.

In some embodiments, each of the first, second, third and fourth flat cables (70-73) includes a plurality of conductors (100) as can be seen in FIG. 4 and FIG. 6. At least some of the conductors in the plurality of conductors have diameters not greater than 24 American Wire Gauge (AWG). In some aspects, at least some of the conductors in the plurality of conductors have diameters not greater than 26 AWG. In other aspects, at least some of the conductors in the plurality of conductors have diameters not greater than 28 AWG, or, not greater than 30 AWG, in some other aspects.

In some embodiments, as best seen in FIG. 4, a plurality of alternating ridges (80) and channels (90) may be disposed on a top side (21) of the upper housing half (20). The alternating ridges (80) and channels (90) extend along a length (x-axis) of the housing (10). In some aspects, the plurality of ridges (80) may be integrally formed with the upper housing half (20), for instance, by extruding metal or other material. In other aspects, the ridges (80) may be built up from separate pieces and held together with the upper housing half (20) by fasteners, bonding, or combination thereof. As best seen in FIG. 4, the fasteners (40) have uppermost surfaces (41), which, upon fastening the upper (20) and lower (30) halves of the housing to each other, are positioned so as to not block the air flow path in the connector assembly. For instance, the uppermost surface (41) of the fasteners (40) may be positioned to be below the air flow channel (110) indicated by dotted lines in FIG. 4. In other instances, the bottom surfaces (91) of the channels (90) along a length (x-axis) of the channels (90) are at a same height or higher than the uppermost surfaces (41) of the fasteners (40) in the plurality of fasteners.

As illustrated in FIG. 5, the channels (90) have open front (92) and rear (93) ends. In some aspects, the fasteners (40) are disposed between the front end (92) of the channels (90) and a front end (22) of the upper housing half (20). The fasteners (40) extend from the upper housing half (20) to the lower housing half (30) passing through the circuit board (60) disposed at least partially in the housing cavity (50). As shown in FIGS. 2 and 3, in some instances, the circuit board (60) includes notches (67) that allow the fasteners (40) to pass through the circuit board (60) while assembling the upper (20) and lower (30) halves of the housing to each other. The notches (67) may be formed close to the edge of the circuit board along the length (x-axis) of the circuit board and between the conductive front pads (63) and the conductive rear pads (64). The notches are formed such that they do not affect the soldering process to connect the conductors (100) to their respective rear pads (64). In some instances, the notches (67) are formed closer to the first conductive rear pads (64a). In some embodiments, the fasteners (40) include at least two rivets that fasten the upper and lower halves of the housing.

The channels (90) are configured to transfer heat generated by the connector assembly (200). When the electrical connector is mated with the mating connector, air flows through the mated module and exits from the exit area (75) (see FIGS. 5 and 6). With bigger cable size, these exit areas may also include extra metal material to hold the cable in place. Therefore, it may be desired that the design of the exit area (75) should be able to hold the cable and also allow the air to flow out smoothly. The bottom surface (91) of each channel (90) may include an inclined surface portion (95) disposed between substantially horizontally oriented front (94) and rear (96) surface portions. Air is directed to flow in the air flow path to transfer heat generated within the connector assembly, and thereby cooling the electronics within the connector assembly, as indicated by arrows in FIGS. 9A and 9B. As best shown in FIG. 9B, the inclined surface portion (95) of each channel (90) is designed to smoothly divert air at the exit area (75), thereby increasing the cooling effect in the connector assembly.

In some instances, the electrical connector assembly (200), for example an OSFP module, may be disposed in one or more cages (not shown) disposed in a network device and the cage may be housed within one or more bays of a chassis of the network device.

The foregoing description, for the purpose of explanation, has been described with reference to specific embodiments. Many modifications and variations are possible in view of the above teachings. Accordingly, the present embodiments are to be considered as illustrative and not restrictive, and the invention is not to be limited to the details given herein, but may be modified within the scope and equivalents of the appended claims.

The invention claimed is:

1. An electrical connector assembly, comprising:
a housing comprising an upper housing half removably assembled to a lower housing half via a plurality of fasteners, the upper and lower housing halves defining a housing cavity therebetween;
a circuit board at least partially disposed in the housing cavity and comprising:
a mating end for mating with electrical contacts of a mating connector, and a cable end opposite the mating end and disposed inside the housing cavity;
a plurality of conductive front pads disposed near the mating end of the circuit board; and
a plurality of conductive rear pads disposed between the front pads and the cable end and electrically connected to the front pads;
stacked first, second and third flat cables terminated at the conductive rear pads disposed on an upper major surface of the circuit board;
a fourth flat cable terminated at the conductive rear pads disposed on an opposing lower major surface of the circuit board; and
a plurality of alternating ridges and channels disposed on a top side of the upper housing half and extending along a length of the housing, wherein bottom surfaces of the channels along a length of the channels are at a same height or higher than uppermost surfaces of the fasteners in the plurality of fasteners, wherein the fasteners comprise a pair of fasteners disposed between a front end of the channels and a front end of the upper housing half, and wherein the fasteners pass through the circuit board.

2. The electrical connector assembly of claim 1, wherein the plurality of conductive front pads forms a first row of conductive front pads disposed on the upper major surface of the circuit board near the mating end, and a second row of conductive front pads disposed on the lower major surface of the circuit board near the mating end.

3. The electrical connector assembly of claim 1, wherein the plurality of conductive rear pads forms spaced apart substantially parallel first, second and third rows of conductive rear pads disposed on the upper major surface of the circuit board between the front pads and the cable end, and a fourth row of conductive rear pads disposed on the lower major surface of the circuit board between the front pads and the cable end.

4. The electrical connector assembly of claim 3, wherein the first, second and third flat cables are terminated at the respective first, second and third rows of conductive rear pads, and the fourth flat cable is terminated at the fourth row of conductive rear pads.

5. The electrical connector assembly of claim 1, wherein the channels have open front and rear ends, wherein the bottom surface of each channel comprises an inclined surface portion disposed between substantially horizontally oriented front and rear surface portions, and wherein the channels are configured to transfer heat generated by the connector assembly.

6. The electrical connector assembly of claim 1, wherein each of the first, second, third and fourth flat cables comprises a plurality of conductors, and wherein at least some of the conductors in the plurality of conductors have diameters not greater than 24 American Wire Gauge (AWG).

7. The electrical connector assembly of claim 6, wherein at least some of the conductors in the plurality of conductors have diameters not greater than 26 American Wire Gauge (AWG).

8. The electrical connector assembly of claim 6, wherein at least some of the conductors in the plurality of conductors have diameters not greater than 28 American Wire Gauge (AWG).

9. The electrical connector assembly of claim 6, wherein at least some of the conductors in the plurality of conductors have diameters not greater than 30 American Wire Gauge (AWG).

10. The electrical connector assembly of claim 1, wherein at least one of the fasteners in the plurality of fasteners comprises a nut threadably engaging a bolt.

11. The electrical connector assembly of claim 1, wherein at least one of the fasteners in the plurality of fasteners comprises a rivet.

12. The electrical connector assembly of claim 1, wherein the housing is a housing of an octal small form-factor pluggable (OSFP) connector.

13. The electrical connector assembly of claim 1, wherein the upper and lower housing halves are made of metal.

14. An electrical connector assembly, comprising:
a housing comprising an upper housing half removably assembled to a lower housing half via a plurality of fasteners, the upper and lower housing halves defining a housing cavity therebetween;
a circuit board at least partially disposed in the housing cavity and comprising a plurality of conductive pads;
at least three flat cables terminated at the conductive pads; and
a plurality of alternating ridges and channels disposed on a top side of the upper housing half and extending along a length of the housing, the channels comprising open front and rear ends, wherein bottom surfaces of the channels along a length of the channels are at a same height or higher than uppermost surfaces of the fasteners in the plurality of fasteners, and wherein the bottom surface of each channel comprises an inclined surface portion disposed between substantially horizontally oriented front and rear surface portions, wherein the fasteners comprise a pair of fasteners disposed between a front end of the channels and a front end of the upper housing half, and wherein the fasteners pass through the circuit board.

15. The electrical connector assembly of claim 14, wherein at least one of the fasteners in the plurality of fasteners comprises a rivet.

\* \* \* \* \*